(12) United States Patent
Bristow

(10) Patent No.: US 7,412,216 B2
(45) Date of Patent: Aug. 12, 2008

(54) RADIO TRANSMITTER

(75) Inventor: Robert Bristow, Basingstoke (GB)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 10/548,206

(22) PCT Filed: Mar. 17, 2004

(86) PCT No.: PCT/EP2004/002762

§ 371 (c)(1),
(2), (4) Date: Aug. 28, 2006

(87) PCT Pub. No.: WO2004/084425

PCT Pub. Date: Sep. 30, 2004

(65) Prior Publication Data

US 2007/0037533 A1 Feb. 15, 2007

Related U.S. Application Data

(60) Provisional application No. 60/457,267, filed on Mar. 25, 2003.

(30) Foreign Application Priority Data

Mar. 18, 2003 (EP) .................................. 03251667

(51) Int. Cl.
*H01Q 11/12* (2006.01)
*H04B 1/04* (2006.01)

(52) U.S. Cl. ............... 455/127.2; 455/114.3; 455/127.5

(58) Field of Classification Search .............. 455/114.2, 455/114.3, 127.1, 127.5, 127.2
See application file for complete search history.

(56) References Cited

U.S. PATENT DOCUMENTS

| 4,969,210 | A | * | 11/1990 | Hansen et al. | ........... 455/188.1 |
|---|---|---|---|---|---|
| 5,151,664 | A | * | 9/1992 | Suematsu et al. | ........... 330/149 |
| 5,598,405 | A | * | 1/1997 | Hirose | ........... 370/280 |
| 5,697,073 | A | | 12/1997 | Daniel et al. | |
| 5,703,909 | A | * | 12/1997 | Fang et al. | ........... 375/295 |
| 5,894,592 | A | | 4/1999 | Brueske et al. | |
| 6,226,276 | B1 | * | 5/2001 | Na | ........... 370/294 |
| 6,489,818 | B2 | * | 12/2002 | Vaucher et al. | ........... 327/117 |
| 7,031,675 | B2 | * | 4/2006 | Kokubo | ........... 455/119 |
| 7,046,972 | B2 | * | 5/2006 | Matsuyoshi et al. | ....... 455/114.3 |
| 2002/0049047 | A1 | * | 4/2002 | Elder et al. | ........... 455/260 |
| 2002/0140512 | A1 | * | 10/2002 | Stockton | ........... 331/11 |
| 2004/0198273 | A1 | * | 10/2004 | Okada et al. | ........... 455/127.1 |

OTHER PUBLICATIONS

Peter Weger at al., "Completely Integrated 105 GHz Direct Conversion Transceiver", IEEE Symposium on VLSI Circuits Digest of Technical Papers, Jun. 9-11, 1994, pp. 135-136.

* cited by examiner

*Primary Examiner*—Edward Urban
*Assistant Examiner*—Christian A Hannon
(74) *Attorney, Agent, or Firm*—Michael Cameron

(57) ABSTRACT

A radio transmitter includes a transmitter circuit which produces a signal at a first frequency, and has digital divider circuitry, for dividing the first frequency to produce a signal at a second frequency. The noise performance of the digital divider is adjusted, depending upon the transmitter output power. Specifically, the digital divider is operated with a relatively good noise performance when the gain of the power amplifier is high, and is operated with a worse noise performance at low output powers. This can ensure that a specified noise requirement is met, without excessively increasing the power consumption or the size of the device.

4 Claims, 4 Drawing Sheets

RADIO TRANSMITTER

CROSS-REFERENCE TO RELATED APPLICATIONS

This patent application claims the benefit of priority from U.S. Provisional Patent Application Ser. No. 60/457,267 filed on Mar. 25, 2003. This application incorporates by reference the entire disclosure of U.S. Provisional Patent Application Ser. No. 60/457,267.

TECHNICAL FIELD OF THE INVENTION

This invention relates to a radio transmitter, and in particular to a transmitter which can be used in a digital radio communications system, for example such as a cellular mobile telephone system.

BACKGROUND OF THE INVENTION

In digital mobile radio communications systems, mobile transmitters must provide relatively high output power in the desired transmission channel, while suppressing powers transmitted in other channels sufficiently to avoid interference with other transmissions, for example with received signals on other nearby mobile transmitters.

In order to ensure as far as possible that these problems are minimised, the standards, such as the GSM standard, set minimum specifications which devices must meet.

At the same time, particularly in the case of portable radio transmitters such as mobile telephones and other handheld devices, there is a desire to minimise the size of the transmitter circuitry and its power consumption, and hence maximise its battery life.

One known technique used in the transmitter circuitry of mobile telephones, is to generate a signal using a voltage controlled oscillator, at a frequency which is a multiple of the desired transmit frequency. This generated signal is then frequency divided down to the desired transmit frequency. This arrangement has the advantage that the physical size of a voltage controlled oscillator, within an integrated circuit, is generally approximately inversely proportional to its output frequency. Therefore, in order to generate an output signal at 1.8 GHz, less silicon area is occupied by a voltage controlled oscillator which produces a signal at 3.6 GHz, followed by a frequency divider which halves that frequency, than would be occupied by a voltage controlled oscillator producing the signal directly at 1.8 GHz.

Moreover, in the case of GSM, two transmit frequency bands are used, one in the region of 1.8 GHz, and one in the region of 900 MHz. Signals in both of these bands can conveniently be generated by a single voltage controlled oscillator producing a signal at 3.6 GHz, followed by a divider, whose division ratio can be set either at two or at four.

The document 'Completely Integrated 1.5 GHz Direct Conversion Transceiver' by Weger P et al from the 1994 Symposium on VLSI Circuits Digest of Technical Papers discloses a transceiver that includes a frequency generator and digital divider circuitry for generating signals up to 1.5 GHz. The transceiver also includes a power amplifier for amplifying the generated signal for transmission.

One disadvantage of using this technique for producing the output signals is that the frequency divider introduces a source of noise into the transmit circuitry. As mentioned above, the GSM specification places limits on the permissible noise.

One way of reducing this problem is to operate the frequency divider at low impedance, but this requires a relatively high current to be supplied to the frequency divider, thereby increasing the power consumption of the circuitry.

An alternative solution is to filter the output before it is supplied to the power amplifier, but this increases the overall size of the device, and adds cost.

U.S. Pat. No. 5,894,592 (Brueske et al.) discloses a wideband phase-lock loop frequency synthesiser that includes a divide-by-two divider, a quadrature detector, an offset VCO and offset mixer for generating a quadrature phase modulated signal. A programmable filter is used for removing predetermined harmonic components of the offset mixed signal enabling the synthesiser to operate over a wide frequency range.

SUMMARY OF THE INVENTION

According to the present invention, it is recognised that, according to the GSM specification, the maximum permissible noise level is independent of the output signal power. However, the noise contribution from the digital divider in the output signal depends on the gain of the power amplifier, and is therefore lower at low output powers.

According to the present invention, therefore, there is provided a transmitter circuit which produces a signal at a first frequency, and has digital divider circuitry, for dividing the first frequency to produce a signal at a second frequency, in which the noise performance of the digital divider is adjusted, depending upon the transmitter output power.

In one embodiment of the invention, the bias current of a digital divider is adjusted in dependence upon the transmitter output power.

In an alternative embodiment of the present invention, the voltage controlled oscillator output signal can be directed to one of two digital divider circuits in dependence upon the transmitter output power, these two digital divider circuits having noise performances which are optimised for different output power settings.

Although the invention is described hereinafter with reference to a GSM system, it will be appreciated that the invention is applicable to other types of communication systems in which the maximum permissible noise level is independent of the output signal power, such as GPRS and CDMA systems.

It should be emphasised that the term "comprises" or "comprising" when used in this specification indicates the presence of the stated features, integers, steps or components, but does not preclude the presence or addition of one or more other features, integers, steps or components, or groups thereof.

DETAILED DESCRIPTION OF PREFERRED EMBODIMENTS

Figure 1:
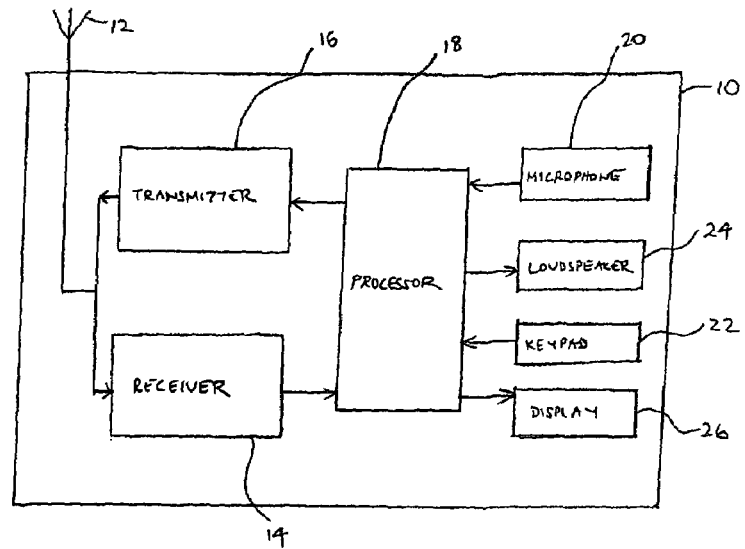
FIG. 1 is a block schematic diagram of a mobile telephone in accordance with an aspect of the present invention.

FIG. 1 is a block schematic diagram of a mobile telephone in accordance with an aspect of the present invention. This is an example of the type of portable communication apparatus, in which the invention can be applied.

As is conventional, the mobile phone 10 has an antenna 12, which is used for transmitting and receiving radio frequency signals. Received signals are passed to receiver circuitry 14, while transmitted signals are sent to the antenna 12 from transmitter circuitry 16. The receiver circuitry 14 and transmitter circuitry 16 are both connected to processor circuitry 18 which, in this case, is used to represent both signal processing circuitry and a control processor which controls the operation of the device. The processor circuitry 18 receives audio inputs from a microphone 20, and alphanumeric or other inputs from a keypad 22, and provides audio outputs through a loudspeaker 24, and visual outputs through a display 26.

Figure 2:
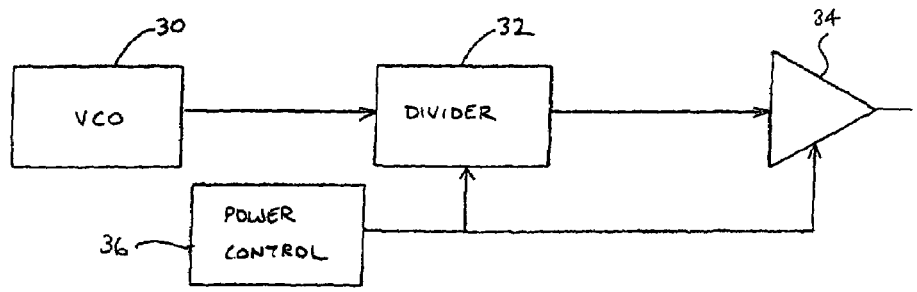
FIG. 2 is a block schematic diagram of transmitter circuitry in accordance with a second aspect of the present invention.

FIG. 2 is a block schematic diagram of the relevant parts of the transmitter circuitry 16, which is otherwise conventional, but is described herein only to the extent necessary for an understanding of the present invention. The transmitter circuitry includes a voltage controlled oscillator (VCO) 30, which may for example produce an output signal at a frequency in the region of 3.6 GHz, with the exact frequency being determined by the channel on which the device is transmitting. The VCO output signal is supplied to a digital divider 32 which, under the control of the processor 18 and depending upon the frequency band in which the device is operating, may divide the frequency of the output signal either by two or by four. Thus, in the case where the device is operating in the 900 MHz band, the VCO output signal frequency must be divided by four, whereas, when the device is operating in the 1800 MHz band, the frequency of the VCO output signal must be divided by two.

The resulting divider output signal, at the desired transmit frequency, is then supplied to a power amplifier 34. This produces an output signal for supplying to the antenna 12.

In order to minimise power consumption in the device, and in order to reduce the possibility of interference between transmissions from different devices, while at the same time ensuring that transmitted signals can be successfully detected in the receiver, the output power of transmissions from the device must be carefully controlled, and the power amplifier 34 receives a power control input signal from power control circuitry 36. This power control signal effectively alters the gain of the power amplifier, so that the power amplifier output signal is at the desired power level.

The divider 32 introduces a source of noise into the output signal, while the power amplifier 34 inevitably amplifies any noise which is present at its input, whether that originates in the VCO 30, or in the divider 32. The GSM specification sets a maximum permissible absolute noise power level in transmitted signals, in order to minimise the possibility that the noise in a transmitted signal will interfere with received signals at a nearby device.

When the power amplifier 34 is operating with a high gain, in order to ensure that the transmitted signal has a desired relatively high power level, then it also amplifies the noise signal at the same time. Therefore, it is when the power amplifier 34 is operating with high gain that it is most important to ensure that the divider 32 is introducing the smallest possible amount of noise.

The noise performance of the divider 32 is improved by increasing the bias current supplied to it. However, this obviously increases the power consumption of the device.

Therefore, in accordance with an aspect of the invention, the bias current of the divider 32 is controlled on the basis of the power control signal from the power control circuitry 36 such that, when the power amplifier 34 is operating with high gain, the bias current in the divider 32 is kept relatively high, in order to improve the noise performance of the divider. However, when the power amplifier 34 is being operated at lower gain, the divider 32 can be operated with a lower bias current, and therefore a worse noise performance, since it will still then be possible to meet the requirements of the specification regarding noise, while reducing power consumption.

Reference is made below, for purposes of illustration, to the GSM specification. However, the invention is also applicable to other communication systems, for example using GPRS or CDMA.

In the GSM specification, the maximum permitted noise level at the transmitter output is −79 dBm. Therefore, in order to meet the specification, the noise generated by the transmitter circuitry after amplification by the power amplifier 34 must be less than −79 dBm. This can be expressed $$N_t + G_{pa} < -79 \text{ dBm}$$

where $N_t$ is the noise generated by the transmitter circuitry (including the noise from the divider 32) and $G_{pa}$ is the gain of the power amplifier 34. Therefore when the gain of the power amplifier 34 is low, the noise generated by the divider 32 can be higher than when the gain of the power amplifier 34 is high.

Figure 3:
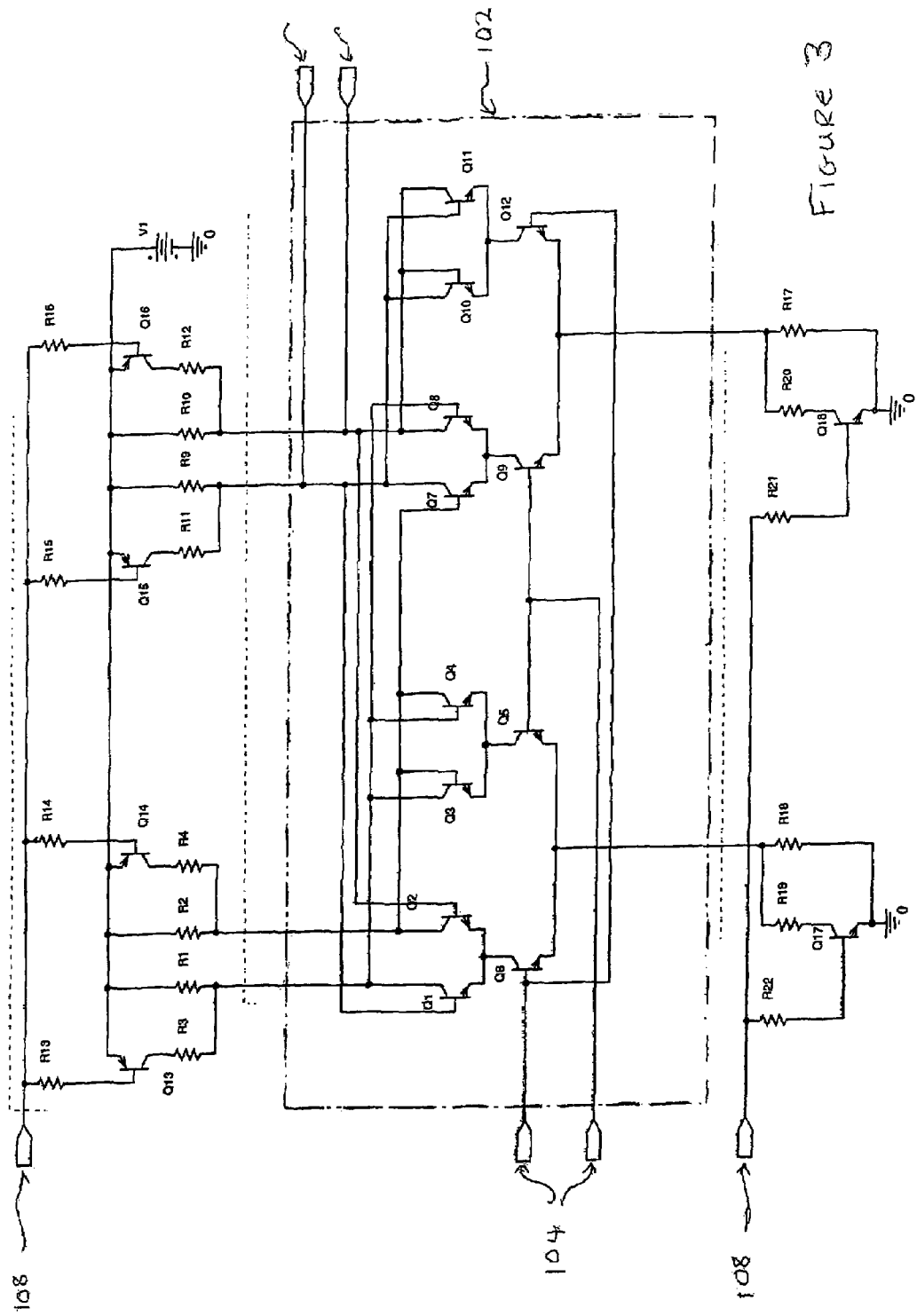
FIG. 3 is a circuit schematic of a variable current divider in accordance with the second aspect of the present invention.

FIG. 3 shows a circuit schematic of the variable current divider 32 in accordance with the invention.

The variable current divider circuit 32 shown here is configured to divide the frequency of the incoming signals by two, although it will be appreciated that the technique described below is also applicable to variable current divider circuitry having other divide ratios.

The divider circuit comprises a divide-by-2 circuit 102 having signal inputs 104 and signal outputs 106. The divide-by-2 circuit 102 is a conventional divider circuit based on flip-flops comprising transistors Q1 to Q12.

The noise properties of the divider 32 are controlled by the power control signal 108 from the power control circuitry 36. In this embodiment, the power control signal 108 is a digital signal taking the values of 0 or 1. When the divider circuitry 32 is required to have a good noise profile (i.e. high current, low impedance) the power control signal has the value 1. Conversely, when a poorer noise profile is tolerable, (i.e. low current, high impedance) the power control signal has the value 0.

The power control signal 108 controls the current at both the collector inputs and emitter outputs of the divide-by-2 circuitry 102 by changing the resistance seen by the divide-by-2 circuitry 102.

Resistors R1, R2, R9 and R10 are connected between the voltage supply rail and the collector inputs of transistors Q1, Q2, Q7 and Q8 respectively. Connected in parallel with each of the resistors R1, R2, R9 and R10 are a second resistor (R3, R4, R11 and R12 respectively) and a transistor switch (Q13, Q14, Q15 and Q16 respectively). The base of each of the transistor switches Q13, Q14, Q15 and Q16 is controlled by the power control signal 108.

Resistor R18 is connected between ground and the combined emitter outputs of transistors Q5 and Q6. Resistor R17 is connected between ground and the combined emitter outputs of Q9 and Q12. Connected in parallel with each of resistors R18 and R17 is a second resistor (R19 and R20 respectively) and a transistor switch (Q17 and Q18 respectively). The base of each of the transistor switches Q17 and Q18 is controlled by the power control signal 108.

When the power control signal has the value 0 (i.e. low current, high impedance), the base of the transistor switches Q13, Q14, Q15, Q16, Q17 and Q18 are 0, and the switches are off. Therefore, the impedances at the collectors of transistors Q1, Q2, Q7 and Q8 will be R1, R2, R9 and R10 respectively. The impedances at the combined emitter outputs of Q5 and Q6 and Q9 and Q12 will be R18 and R17 respectively.

When the power control signal has the value 1 (i.e. high current, low impedance), the transistor switches Q13, Q14, Q15, Q16, Q17 and Q18 will be on. Therefore, the impedances at the collectors of transistors Q1, Q2, Q7 and Q8 and at the combined emitter outputs of Q5 and Q6 and Q9 and Q12 will be reduced since resistors R1, R2, R9, R10, R18 and R17 are now in parallel with resistors R3, R4, R11, R12, R19 and R20 respectively. Therefore the effective impedance is reduced, and the current is increased, providing a better noise profile.

Figure 4:
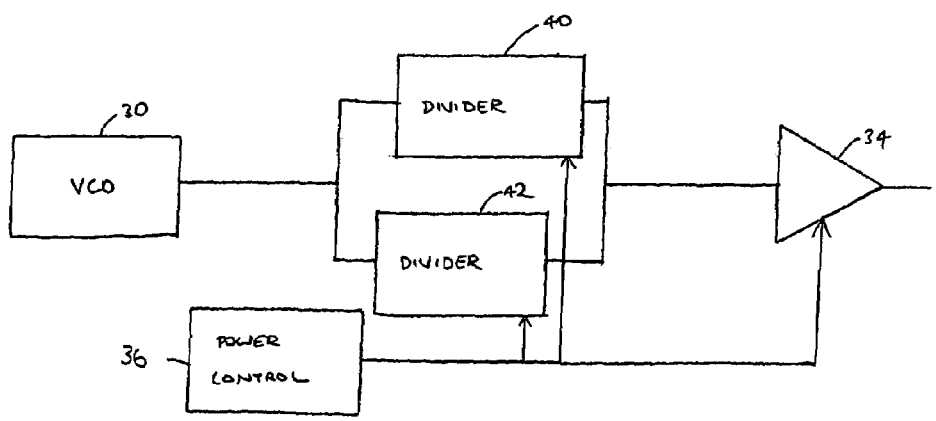
FIG. 4 is a block schematic diagram of transmitter circuitry in accordance with an alternative embodiment of the second aspect of the invention.

FIG. 4 shows an alternative embodiment of the transmit circuitry 16, in which elements which have the same function as elements in the circuitry of FIG. 2 are illustrated by the same reference numerals, and will not be described further.

In the embodiment shown in FIG. 4, there are two divider circuits 40, 42, each of which may be programmable to divide the frequency of incoming signals either by two or by four, as described above in the case of the divider 32 shown in FIG. 2. However, in this case, the divider circuits 40, 42 are biased for high current operation and for low current operation respectively.

Figure 5:
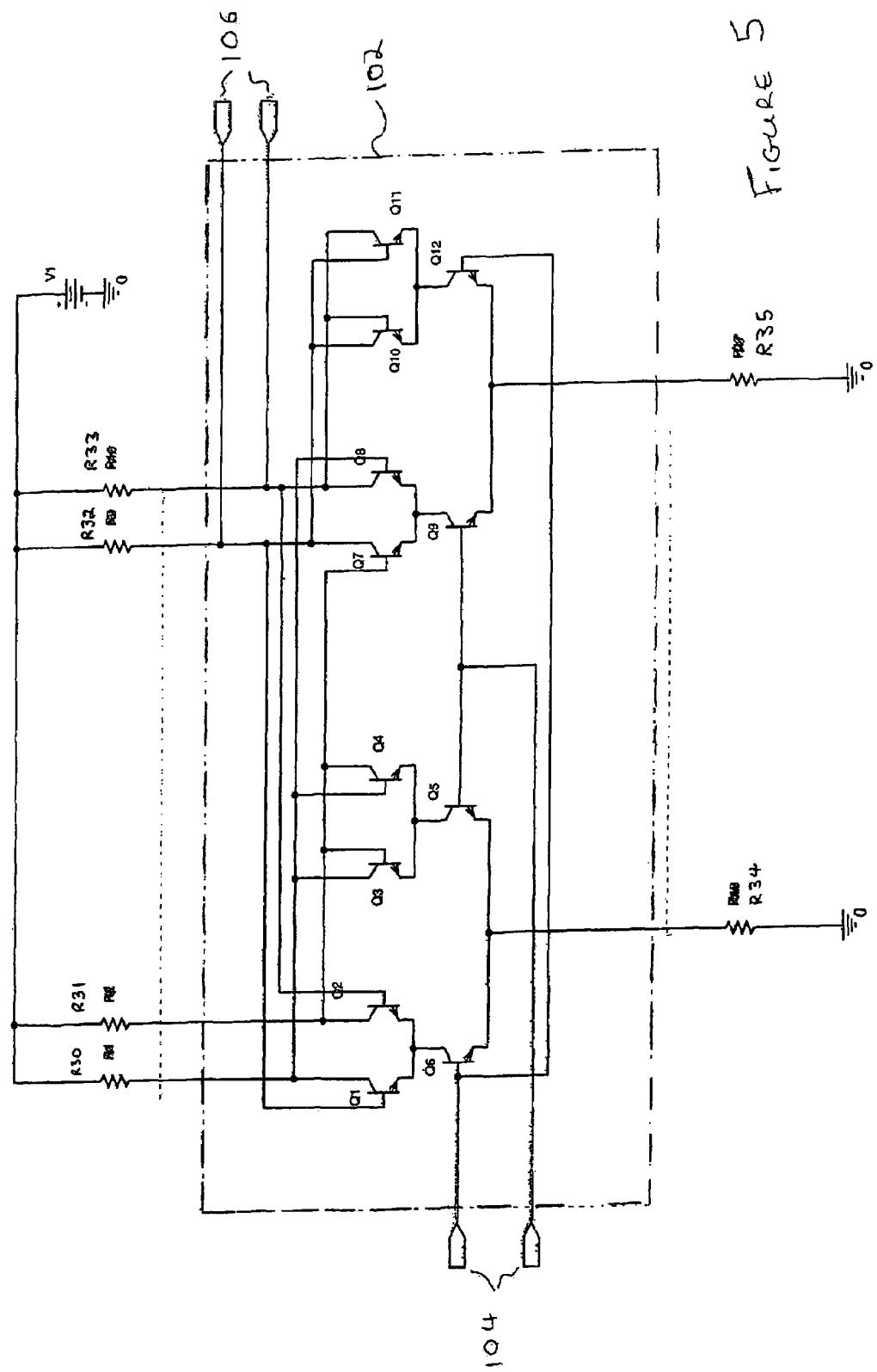
FIG. 5 is a circuit schematic of a fixed current divider in accordance with the alternative embodiment of the second aspect of the present invention.

In this illustrated embodiment, each of the divider circuits 40, 42 comprise a fixed current divider circuit as shown in FIG. 5. The fixed current divider circuit shown here is configured to divide the frequency of the incoming signals by two, although it will be appreciated that the technique described below is also applicable to divider circuitry having other divide ratios.

The divider circuit comprises a divide-by-2 circuit 102 having signal inputs 104 and signal outputs 106. The divide-by-2 circuit 102 is a conventional divider circuit based on flip-flops comprising transistors Q1 to Q12.

Resistors R30, R31, R32 and R33 are connected between the positive voltage rail and the collectors of transistors Q1, Q2, Q7 and Q8 respectively. Resistor R34 is connected between ground and the combined emitter outputs of transistors Q5 and Q6. Resistor R35 is connected between ground and the combined emitter outputs of Q9 and Q12. The resistors are the components responsible for controlling the level of noise generated by the divider circuitry 40, 42. Usually, R30=R31, R32=R33 and R34=R35. The values of these resistors are chosen to set the operating current and therefore the noise level generated by the divider circuitry 40, 42.

For example, where the power output is high and a relatively good noise performance is required, the values of the resistors are chosen so that the impedance of the divider circuitry 40 is low. In contrast, where the power output is low and a worse noise performance is permissible, the values of the resistors can be chosen so that the impedance of the divider circuitry 42 is high.

Thus, returning to FIG. 4, when the power control signal from the power control circuitry 36 indicates that the power amplifier 34 is to operate with high gain, the divider 40 is selected, since this has a relatively good noise performance. By contrast, when the power control signal from the power control circuitry 36 indicates that the power amplifier 34 is to operate with lower gain, and hence that there will be less amplification of the noise signals, the divider 42 is selected, since it is then sufficient for the worse noise performance of this device to be used.

Figure 6:
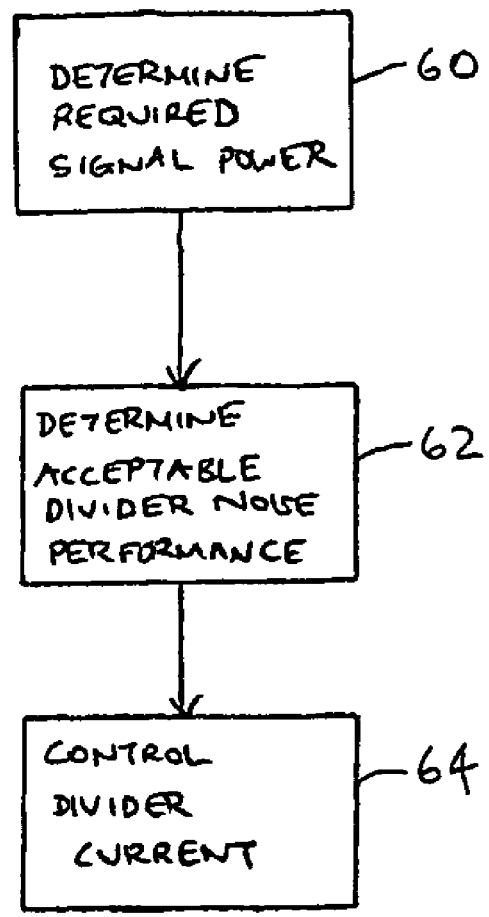
FIG. 6 is a flow chart illustrating a method in accordance with a third aspect of the present invention.

FIG. 6 is a flow chart illustrating a method of operation of the transmitter circuitry as shown in FIG. 2 or FIG. 4. In step 60, the processor circuitry determines the required output signal power to be transmitted. On the basis of the required signal power, the circuitry then determines the acceptable noise performance for the divider circuitry, in step 62, and, in step 64, controls the divider current appropriately.

As discussed above, this control may take the form of adjusting the bias current to the divider circuit, or may take the form of selecting a divider circuit from a plurality of available divider circuits, which have bias currents which are appropriate for different required noise performances. The determination in step 62 may be carried out by means of a mathematical calculation or, more conveniently, can for example be made by comparing the level of the power control signal with a threshold, in order to determine whether the divider circuitry should be operated with a relatively good noise performance, or with a worse noise performance.

It will also be appreciated that, while FIG. 3 and FIG. 5 show specific circuits for achieving the required control, many other circuits could be used to achieve the same results.

To illustrate the principle of the invention, the following example of a GSM radio transmitter is provided. In this example, all elements in the radio transmitter are assumed to be ideal and noiseless, except for the divider output resistors, which generate thermal noise. Also, the input impedance of the power amplifier is assumed to be much higher than the output impedance of the divider, so the power amplifier responds to the voltage at the divider output.

It will be appreciated that in a real design, there are several other sources of noise which must be considered.

The output of the divider is modelled as a voltage source with a real resistive impedance of 60 ohms. The output voltage at the required carrier frequency is assumed to be 0.4V peak to peak.

Therefore the RMS voltage available to the power amplifier at the required frequency is $$\frac{0.4V}{2 \cdot \sqrt{2}} = 0.141 \text{ V}$$

The maximum power required from the mobile phone handset is +33 dBm (the standard power level for a GSM class 4 handset). Assuming a 50 ohm load impedance, and noting that therefore 1 mW is 0.2236 Vrms, this means there is an RMS voltage of:

$$0.2236V \cdot 10^{(33/20)} = 9.988V$$

Therefore the voltage gain of the power amplifier must be:

$$20 \cdot \log\left(\frac{9.988}{0.141}\right) = 37.005 \text{ dB}$$

The collector load resistors are expected to be the dominant noise source of the divider (as mentioned above, in a real design other sources of noise are present). With Boltzmann's constant Kb, a bandwidth of 100 KHz, and assuming room temperature of 298K, the RMS thermal noise voltage is:

$$\sqrt{4 \cdot Kb \cdot (298K) \cdot (100000Hz) \cdot 60 \text{ohm}} = 3.142 \times 10^{-7} \text{V}.$$

Converting this directly to an equivalent dBm figure gives:

$$20 \cdot \log\left[\frac{\sqrt{4 \cdot Kb \cdot (298\,K) \cdot (100000\,Hz) \cdot 60\,ohm}}{0.2236\,V}\right] = -117.046\,\mathrm{dB}m.$$

The GSM specification for the noise level at the transmitter output is −79 dBm, and so the −117.046 dBm noise level can be amplified by about 38 dB before it fails the GSM specification. From the previous reasoning, this noise level is adequate since a gain of 37 dB is required to reach the required maximum level for a class 4 handset.

In accordance with the invention, the power consumption of the divider can be reduced dynamically when the power amplifier is operating with a lower gain as greater noise from the divider can be tolerated.

If the collector resistor values were doubled to 120 ohms, while maintaining the same voltage at the output of the divider, the divider current will be halved.

The noise level at the divider output will now be:

$$20 \cdot \log\left[\frac{\sqrt{4 \cdot Kb \cdot (298\,K) \cdot (100000\,Hz) \cdot 120\,ohm}}{0.2236\,V}\right] = -117.036\,\mathrm{dB}m.$$

Therefore, the noise level of the divider circuit is 3 dB higher.

As a result, the GSM noise specification can be satisfied for power amplifier gains up to:

(−114.036−(−79))=35 dB which is only 2 dB short of the full power gain requirement of 37 dB.

Thus this demonstrates that the divider current can be reduced rapidly (halved for every 3 dB increase in the noise of the divider circuit) as the GSM power setting is reduced, and therefore power consumption (and hence battery lifetime) can be improved for settings less than maximum by reducing the current consumed by the divider.

There is therefore described transmitter circuitry, which can ensure that a specified noise requirement is met, without excessively increasing the power consumption or the size of the device.

The invention claimed is:

1. A radio transmitter, comprising:
a frequency generator, for producing a signal at a first frequency;
digital divider circuitry, for dividing the first frequency to produce a signal at a second frequency;
a power amplifier, for amplifying the signal at the second frequency to produce an output signal at a desired power, further comprising control circuitry adapted to adjust a noise performance of the digital divider circuitry on the basis of the desired power, wherein the control circuitry is adapted to cause the digital divider circuitry to operate with a first noise performance at a first desired power and with a second noise performance at a second desired power, wherein the first noise performance is better than the second noise performance when the first desired power is higher than the second desired power, and the first noise performance is poorer than the second noise performance when the first desired power is lower than the second desired power.

2. A radio transmitter, comprising:
a frequency generator, for producing a signal at a first frequency;
digital divider circuitry, for dividing the first frequency to produce a signal at a second frequency;
a power amplifier, for amplifying the signal at the second frequency to produce an output signal at a desired power, further comprising control circuitry adapted to adjust a noise performance of the digital divider circuitry on the basis of the desired power; and
wherein the radio transmitter is for use in a GSM system and the noise performance of the digital divider circuitry $N_t$ is adjusted in dependence upon the gain of the power amplifier $G_{pa}$, such that, for all values of $G_{pa}$: $N_t + G_{pa} < -79\,\mathrm{dB}_m$.

3. A method of operating a radio transmitter having a frequency generator adapted to generate a signal at a first frequency, digital divider circuitry adapted to digitally divide the first frequency to produce a signal at a second frequency and a power amplifier adapted to amplify the signal at the second frequency to produce an output signal at a desired power, comprising the step of:
adjusting a noise performance of the digital divider circuitry on the basis of the desired power by operating the digital divider circuitry with a first noise performance at a first desired power and with a second noise performance at a second desired power, wherein the first noise performance is better than the second noise performance when the first desired power is higher than the second desired power, and the first noise performance is poorer than the second noise performance when the first desired power is lower than the second desired power.

4. The method of claim 3, wherein the radio transmitter is for use in a GSM system and the noise performance of the digital divider circuitry $N_t$ is adjusted in dependence upon the gain of the power amplifier $G_{pa}$ such that, for all values of $G_{pa}$: $N_t + G_{pa} < -79\,\mathrm{dB}_m$.

* * * * *

UNITED STATES PATENT AND TRADEMARK OFFICE
CERTIFICATE OF CORRECTION

PATENT NO. : 7,412,216 B2  
APPLICATION NO. : 10/548206  
DATED : August 12, 2008  
INVENTOR(S) : Bristow Page 1 of 1

It is certified that error appears in the above-identified patent and that said Letters Patent is hereby corrected as shown below:

In Fig. 3, Sheet 2 of 4, above Tag "102", delete " 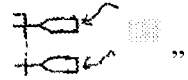 "

and insert -- 106 --, therefor.

In Column 7, Line 26, delete $$\text{``} \log\left[\frac{\sqrt{4 \cdot Kb \cdot (298\,K) \cdot (100000\,Hz) \cdot 120\,ohm}}{0.2236\,V}\right] = -117.036\,dBm. \text{''}$$

and insert --

$$20 \cdot \log\left[\frac{\sqrt{4 \cdot Kb \cdot (298\,K) \cdot (100000\,Hz) \cdot 120\,ohm}}{0.2236\,V}\right] = -114.036\,dBm.$$

--, therefor.

In Column 8, Line 29, in Claim 2, delete "$dB_m$." and insert -- dBm. --, therefor.

In Column 8, Line 51, in Claim 4, delete "$dB_m$." and insert -- dBm. --, therefor.

Signed and Sealed this

Fourth Day of November, 2008

JON W. DUDAS  
*Director of the United States Patent and Trademark Office*